United States Patent
Katayose (10) Patent No.: US 7,228,517 B2
(45) Date of Patent: Jun. 5, 2007

(54) INTEGRATED CIRCUIT DESIGN METHOD AND SYSTEM

(75) Inventor: Yuuji Katayose, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 45 days.

(21) Appl. No.: 10/973,419

(22) Filed: Oct. 27, 2004

(65) Prior Publication Data

US 2005/0097491 A1 May 5, 2005

(30) Foreign Application Priority Data

Oct. 31, 2003 (JP) ............................. 2003-372002

(51) Int. Cl.
*G06F 17/50* (2006.01)

(52) U.S. Cl. ........................................ 716/10; 716/6

(58) Field of Classification Search ............... 716/4, 716/6, 10, 13, 16
See application file for complete search history.

(56) References Cited

U.S. PATENT DOCUMENTS

| 6,928,631 | B2 * | 8/2005 | Matsumoto | ............... | 716/6 |
| 6,941,540 | B2 * | 9/2005 | Kumagai | ............... | 716/16 |
| 2003/0014724 | A1 * | 1/2003 | Kojima et al. | ............... | 716/10 |
| 2004/0111689 | A1 * | 6/2004 | Kanaoka et al. | ............... | 716/13 |

* cited by examiner

*Primary Examiner*—Leigh M. Garbowski
(74) *Attorney, Agent, or Firm*—Foley & Lardner LLP (57) ABSTRACT

A method of designing an integrated circuit where a clock circuit is preformed and a clock connection is determined in a placement process is disclosed. The method includes calculating clock skew between sequential circuits based on clock skew information correlating placement positions of sequential circuits and clock skew between the placement positions, and performing placement in consideration of the calculated clock skew.

9 Claims, 7 Drawing Sheets

Fig. 1

RELATED ART

Fig. 2

RELATED ART

Fig. 3

RELATED ART

INTEGRATED CIRCUIT DESIGN METHOD AND SYSTEM

BACKGROUND OF THE INVENTION

1. Field of the Invention

The present invention relates to integrated circuit (IC) design methods and systems and, particularly, to IC design method and system by timing-driven block placement that imposes timing conditions such as line delay and signal transmission synchronous as constraints and designs IC in consideration of these constraints.

2. Description of Related Art

Recently, as the product-life cycle of electronic equipment using an IC shortens and the product performance improves, reduction in design time and improvement in design quality are required for design automation technology.

However, in IC design automation systems with a top-down approach, path delay expected by the logic design in the upstream of the design process, and path delay of the layout result in the layout design in the downstream of the design process differ in some cases. The path delay in the layout result can be longer than the expected path delay.

If the layout results do not satisfy timing constraints, the circuit configuration should be changed. Thus, it is necessary to repeat the circuit composition, layout, and so on until the layout result that meets the timing constraints is obtained. This increases the IC development period and costs.

To overcome the above problem, a timing-driven technique has been proposed recently. The timing driven technique associates the logic design process in the upstream and the layout design process in the downstream, and imposes the constraint to satisfy the path delay expected in the logic design in the upstream on the layout design in the downstream. This eliminates the difference between the path delay of the layout result and the expected path delay in the upstream.

Figure 1:
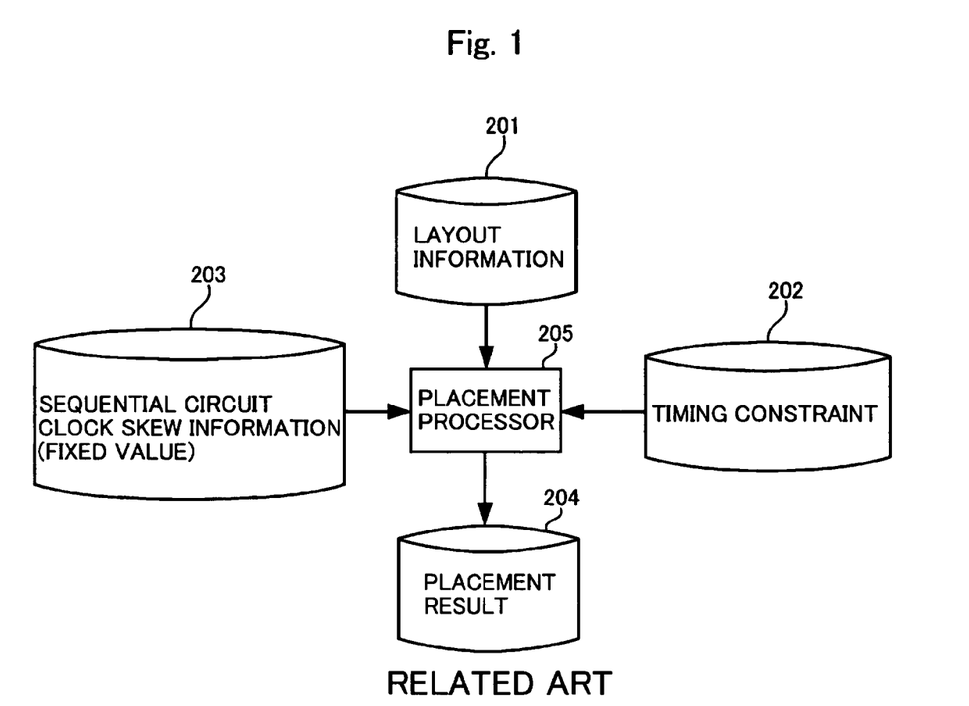
FIG. 1 is a conceptual diagram showing information input and output in a conventional timing-driven placement process.

The timing driven technique is explained hereinafter with reference the drawings. FIG. 1 is a conceptual diagram showing information input or output in a conventional timing-driven placement process.

Generally in conventional timing-driven placement processes, a placement processor 205 receives layout information 201, timing constraint 202, and clock skew information 203. The layout information 201 includes net list, block information, background information, I/O buffer placement information, and hard macro placement information. The timing constraint 202 defines delay on all sequential circuit paths so as to satisfy expected delay calculated in the logic design. The clock skew information 203 includes clock skew information of all sequential circuits The placement processor 205 determines optimal placement position of each block in such a way that path delay Tr between specific sequential circuits satisfies the setup and hold time requirements represented by the following expressions (1) and (2), and outputs a placement result 204.

$$Tr < Ti - Si - St \quad (1)$$

$$Tr > Si + Ht \quad (2)$$

where Ti is an operating period of a specific sequential circuit path extracted from the timing constraint 202, Si is clock skew between sequential circuits extracted from the clock skew information 203, St is a setup time at an end point sequential circuit, and Ht is a hold time at the endpoint sequential circuit. At this time, a fixed value which is uniform in clock domains is defined to the clock skew information 203 of all sequential circuits.

A technique that is widely used recently to reduce a layout time uses a data chip with a preformed clock circuit having a tree structure with equal load and equal line length. This technique can eliminate the need for clock distribution in the layout process.

Figure 2:
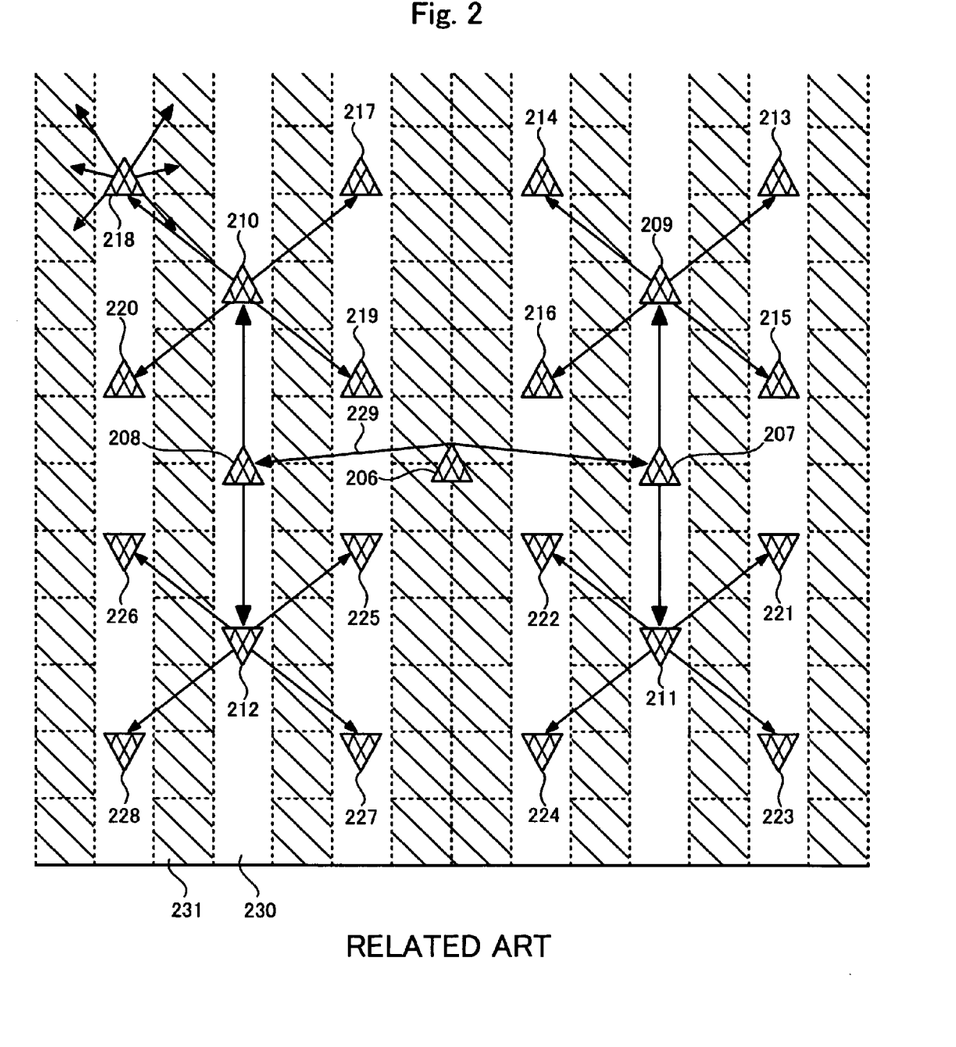
FIG. 2 is a diagram showing a chip structure with a preformed clock circuit having a tree structure with equal load and equal line length.

FIG. 2 shows the chip structure with a preformed clock circuit having a tree structure with equal load and equal line length. In this chip, the clock circuit having clock buffers 206 to 228 and a clock line 229 is preformed. The clock circuit includes the output line from the final-stage clock buffer 218 connected to a sequential circuit. The area including the end of the output line from the final-stage clock buffer 218 is a sequential circuit placement area 231. It is thereby possible to connect a sequential circuit to a clock simply by placing the sequential circuit in any position within the sequential circuit placement area 231 in the placement process. The area other than the sequential circuit placement area 231 is a combinational circuit placement area 230.

However, the present invention has recognized that use of the above structure for the conventional timing-driven placement process causes clock skew to vary widely by the position of the sequential circuit. This causes a wide difference between a clock skew value expected for the placement process and an actual clock skew value calculated from the placement result.

Figure 3:
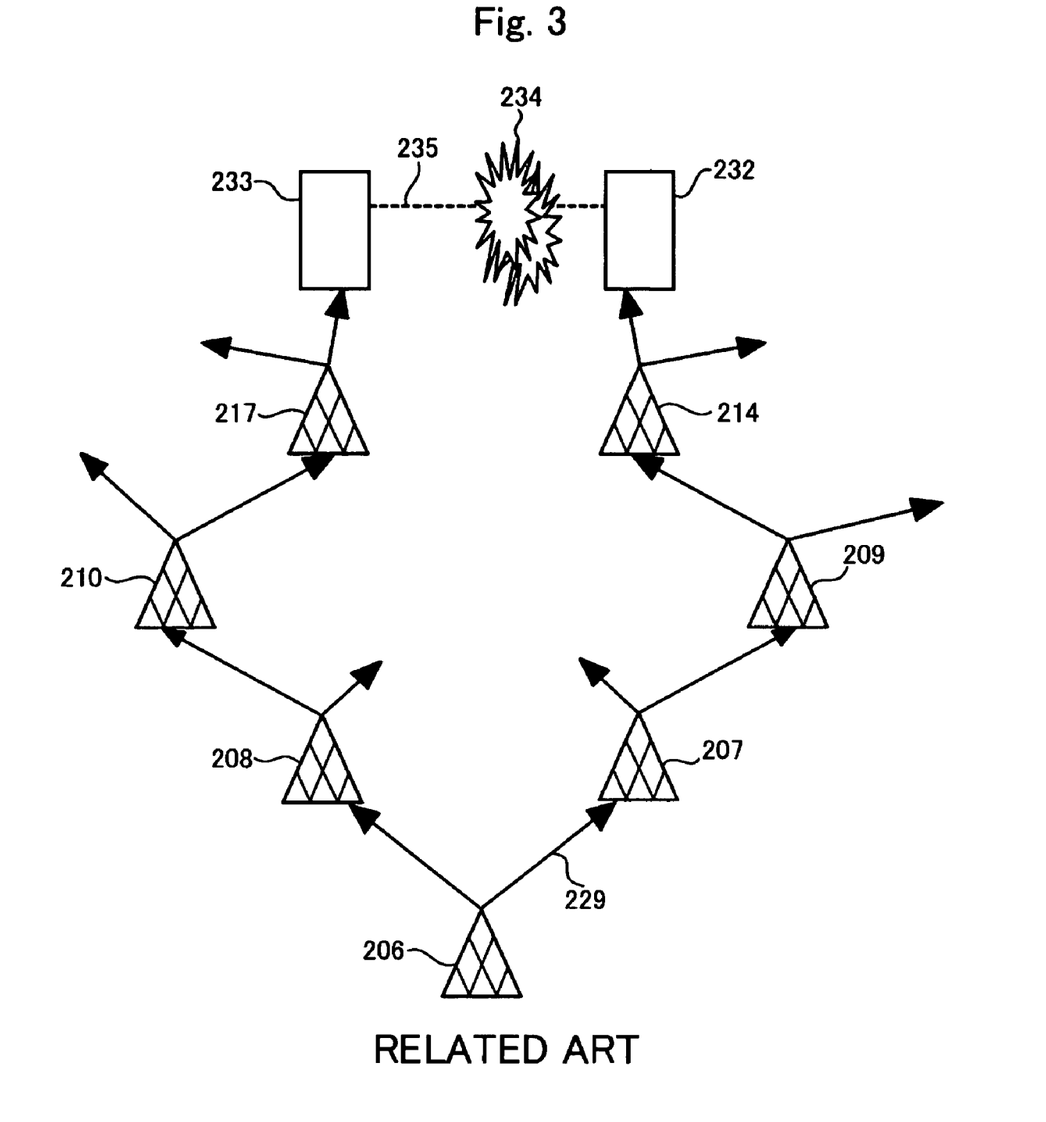
FIG. 3 is a diagram to explain the case of using the clock circuit of FIG. 2 where influence of variation in chip is so large that increases clock skew.

For example, FIG. 3 shows data transmission between sequential circuits 232 and 233 to which a clock is supplied from the final-stage clock buffers 214 and 217, respectively, of FIG. 2. In this case, a branch point of the clock is at the output terminal of a root clock buffer 206. Thus, the clock path from the root of the clock to each of the sequential circuits is totally different. The clock is thereby greatly affected by variation in chip, which increases clock skew.

Figure 4:
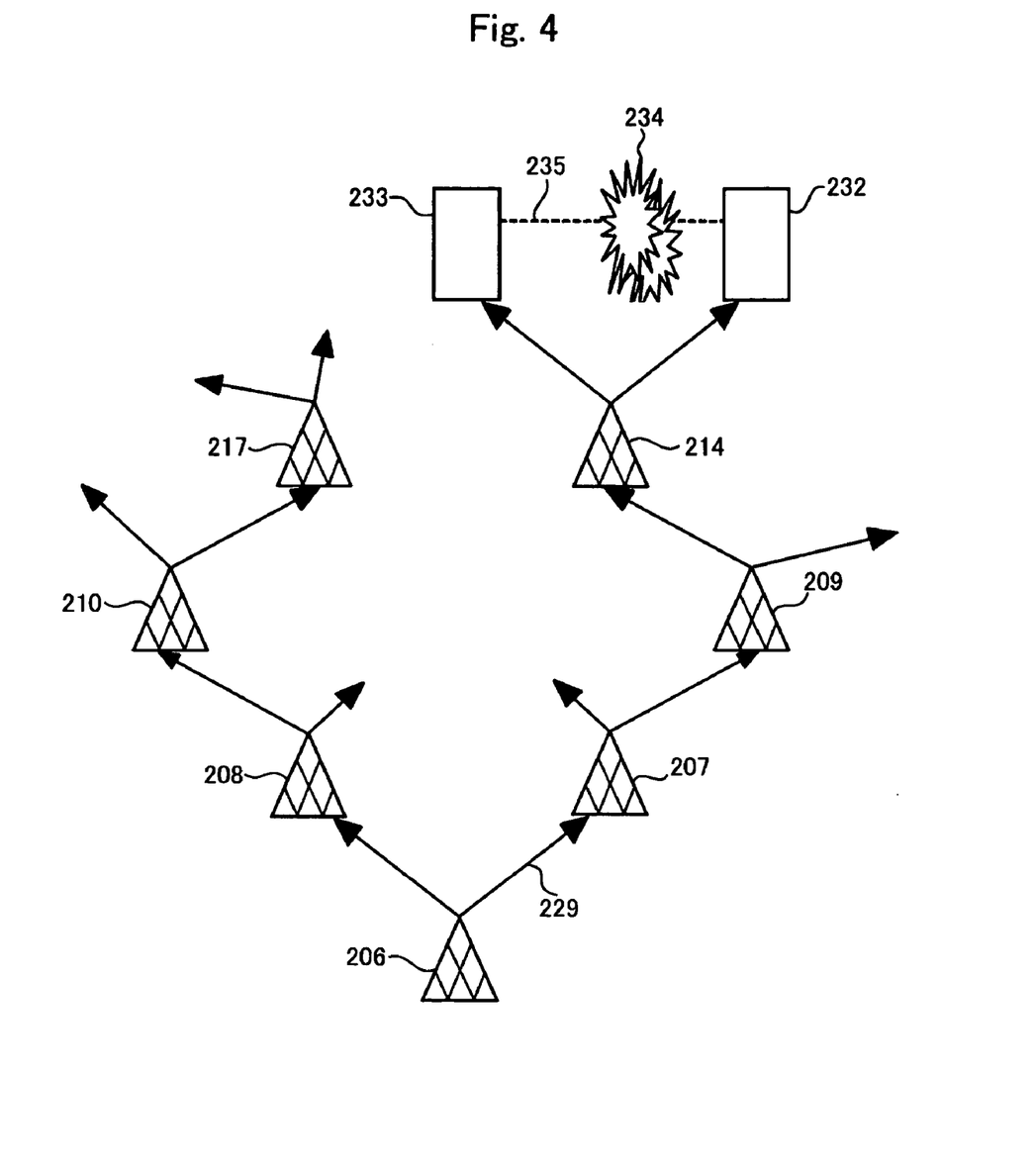
FIG. 4 is a diagram to explain the case of using the clock circuit of FIG. 2 where influence of variation in chip is very small.

On the other hand, FIG. 4 shows data transmission between the sequential circuits 232 and 233 to which a clock is supplied from the final-stage clock buffer 214 of FIG. 2. In this case, a branch point of the clock is at the output terminal of the final-stage clock buffer 214. Thus, the clock path from the root of the clock to each of start and end point sequential circuits is substantially the same. The influence of the variation in chip is thereby very low, causing substantially no clock skew.

If the clock skew widely varies by the position of the sequential circuit, it is difficult to obtain the placement result that meets the setup and hold time requirements. For example, when an actual clock skew value between sequential circuits calculated from the placement result is greater than a clock skew value preset to the timing-driven placement process, even if the placement processor 205 controls the placement to satisfy the expressions (1) and (2), timing analysis based on the actual clock skew after the placement is likely to show failure to meet the setup and hold time requirements.

An approach for the path that satisfies the setup and hold time requirements in the placement processor 205 to completely avoid the problem which is not given by the timing analysis based on the actual clock skew value after the placement is to set the value of the clock skew between sequential circuits applied to the timing-driven placement process to a maximum value of the clock skew calculated from the preformed clock circuit. However, the present invention has recognized that, since the value of clock skew is estimated to be greater than an actual value for most sequential circuit paths in this case, it is difficult to satisfy the expressions (1) and (2) in all the sequential circuit paths within the timing-driven placement processor.

SUMMARY OF THE INVENTION

According to one aspect of the present invention, there is provided a method of designing an integrated circuit where a clock circuit is preformed and a clock connection is determined in a placement process, which includes calculating clock skew between sequential circuits based on clock skew information correlating placement positions of sequential circuits with clock skew between the placement positions; and performing placement in consideration of the calculated clock skew.

According to another aspect of the present invention, there is provided a method of designing an integrated circuit where a clock circuit is preformed and a clock connection is determined in a placement process, which includes calculating clock skew between start and end point sequential circuits at both ends of a specific sequential circuit path based on clock skew information correlating a plurality of placement areas corresponding to a plurality of sequential circuits with clock skew between placement areas arbitrarily selected from the plurality of placement areas; and performing placement of sequential circuits in consideration of the calculated clock skew.

According to another aspect of the present invention, there is provided a method of designing an integrated circuit where a clock circuit is preformed and a clock connection is determined in a placement process, which includes extracting connection information of a sequential circuit path and tentatively placing blocks constituting the path; calculating a transmission delay time of the whole path of the tentatively placed blocks; extracting placement areas of start and end point sequential circuits at both ends of the path; calculating clock skew between the start and end point sequential circuits based on clock skew information correlating placement areas of sequential circuits with clock skew between the placement areas; analyzing timing based on the transmission delay time, the clock skew information, and a timing constraint; and, if the analyzed timing does not meet a predetermined requirement, performing the tentative placement of the blocks, calculation of the transmission delay time, extraction of the placement area of the start and end point sequential circuits, calculation of the clock skew between the start and end point sequential circuits, and analysis of the timing once again.

According to still another aspect of the present invention, there is provided a design system of an integrated circuit where a clock circuit is preformed and a clock connection is determined in a placement process, which includes a storage unit storing clock skew information correlating placement positions of sequential circuits and clock skew between the placement positions; and a placement processing unit calculating clock skew between sequential circuits based on the clock skew information, and performing placement in consideration of the calculated clock skew.

According to yet another aspect of the present invention, there is provided a design system of an integrated circuit where a clock circuit is preformed and a clock connection is determined in a placement process, which includes a storage unit storing clock skew information correlating a plurality of placement areas corresponding to a plurality of sequential circuits and clock skew between placement areas arbitrarily selected from the plurality of placement areas; and a placement processing unit calculating clock skew between start and end point sequential circuits at both ends of a specific sequential circuit path placed in a placement area based on the clock skew information, and performing placement of sequential circuits in consideration of the calculated clock skew.

The present invention allows IC design to obtain a placement result that satisfies setup and hold time requirements more easily. This almost eliminates the need for repeating circuit composition, layout, and so on, thereby shortening IC design period and minimizing development costs.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

The present invention calculates clock skew between start and end point sequential circuits based on a correspondence table of the placement position of the start and end point sequential circuits at both ends of a specific sequential circuit path, the placement position of the sequential circuits calculated from a preformed clock circuit, and clock skew, and uses the calculated clock skew value for the placement process.

This allows considering clock skew which is very close to an actual value when optimizing the timing of the sequential circuit path. It is thereby possible to obtain the placement result that satisfies setup and hold time requirements more easily than conventional techniques.

A first embodiment of the present invention is explained hereinafter.

Figure 5:
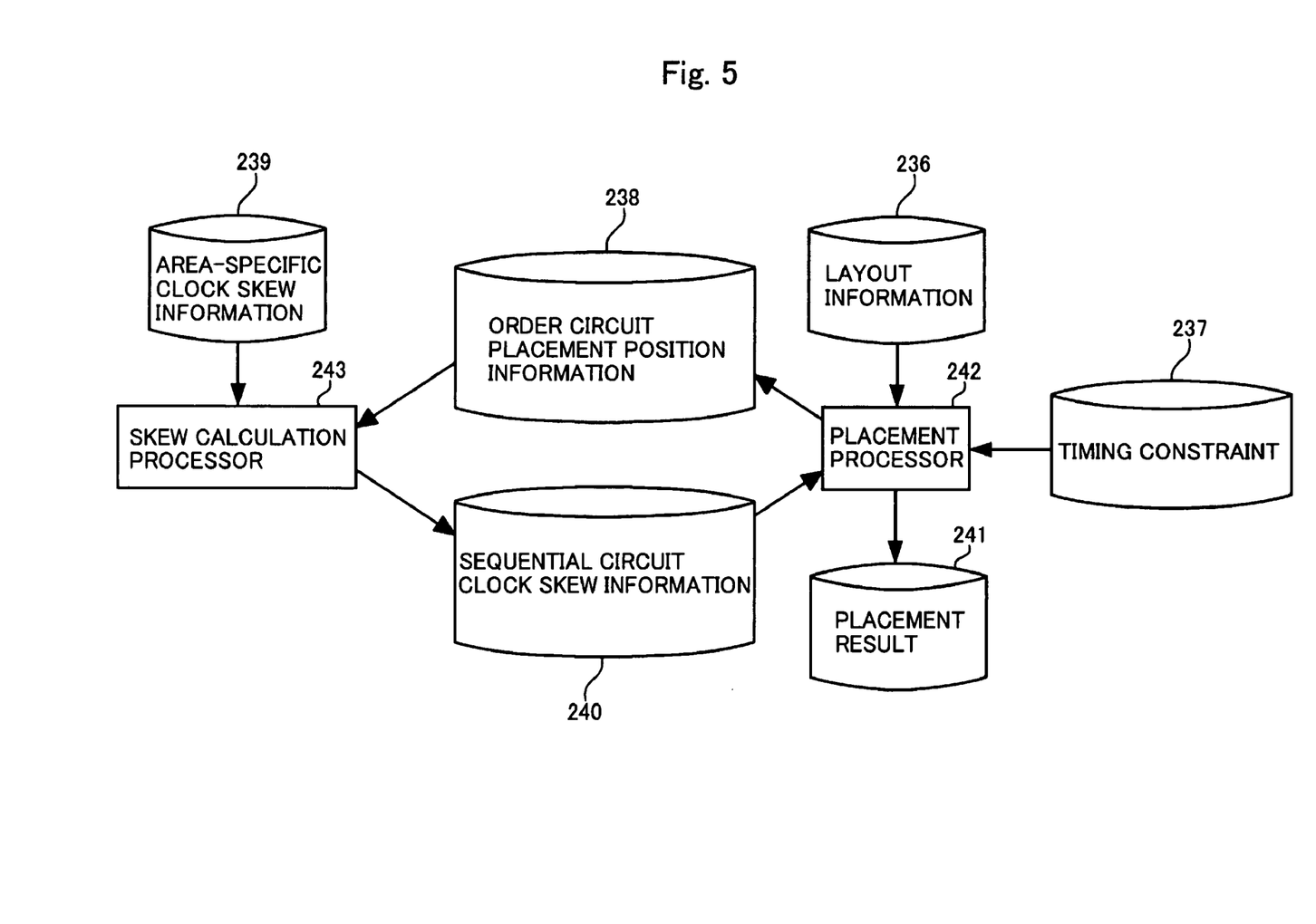
FIG. 5 is a diagram showing the structure of a timing-driven placement system according to the present invention.

FIG. 5 is a block diagram of the timing-driven placement of this embodiment

In the timing-driven placement system of this embodiment, a clock skew calculation processor 243 calculates clock skew based on sequential circuit position information 238 extracted from placement processor 242 and area-specific clock skew information 239, and then outputs sequential circuit clock skew information 240.

The timing-driven placement system of this embodiment feeds the calculated clock skew information 240 back to the placement processor 242. The placement processor 242 thereby determines the optimal placement position of each block based on the skew value, the layout information 236, and the timing constraint 237 so that delay Tr on a specific sequential circuit path satisfies the setup and hold time requirements represented by the expressions (1) and (2), and outputs placement result 241.

Figure 6:
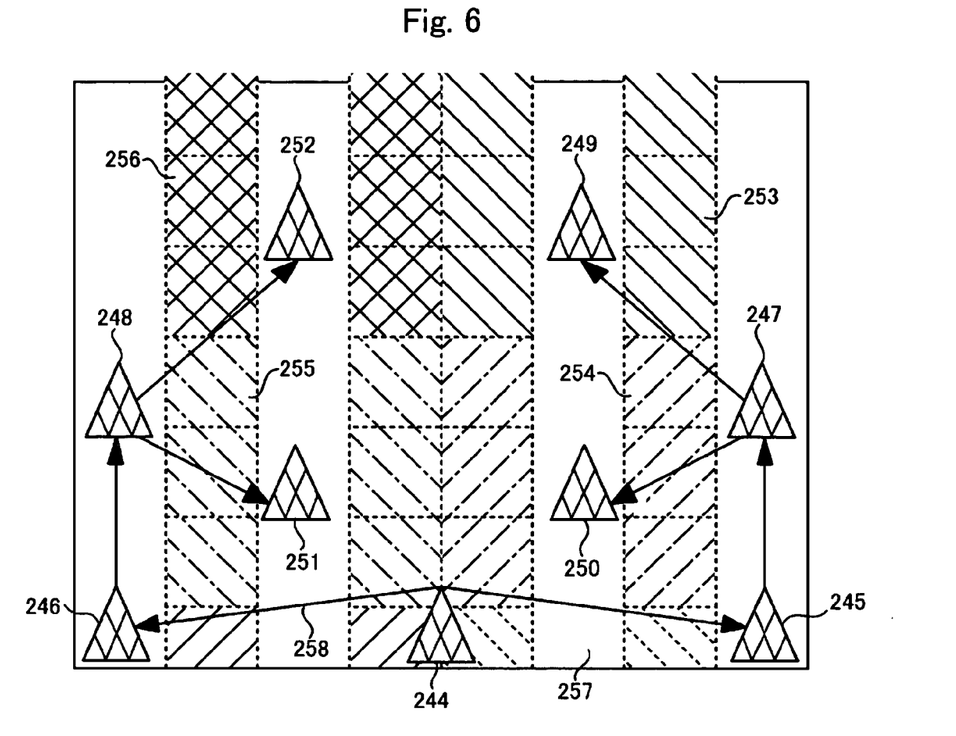
FIG. 6 is an enlarged view of a part of FIG. 2.

The area-specific clock skew information 239 is correspondence information between sequential circuit placement position and clock skew calculated from the configuration of the clock circuit preformed in the chip structure shown in FIG. 2. FIG. 6 is an enlarged view of a part of FIG. 2. The clock circuit distributes a clock from a root clock buffer 244, through final-stage clock buffers 249, 250, 251, and 252, to sequential circuit placement area nearest to each of the final-stage clock buffers. The sequential circuit placement area is divided into clock supply areas 253, 254, 255, and 256, to which a clock is supplied from the final-stage clock buffers 249, 250, 251, and 252, respectively. Each of the final-stage clock buffers and each of the clock supply areas are thereby correlated.

In this way, a plurality of sequential circuit placement areas and clock skew between two placement areas arbitrarily selected from the plurality of sequential circuit placement areas are correlated for all the areas. This is the area-specific clock skew information 239. One sequential circuit placement area corresponds to one final-stage clock buffer. Thus, the sequential circuit placed in one sequential circuit placement area receives a clock from one final-stage clock buffer.

Since a clock supply path from the root clock buffer to the sequential circuit placement area is preformed in the clock circuit, it is possible to calculate a difference in the transmission delay from the root clock buffer to the input terminal of each of the final-stage clock buffers in consideration of maximum variation in chip. If the output load capacitance of each final-stage clock buffer which varies by the number of connected sequential circuits and influence of variation in chip on the clock path from the input terminal of each final-stage clock buffer to the input terminal of the sequential circuit are negligibly small, it is possible to transpose a difference in the transmission delay from the root clock buffer to the input terminal of each of the final-stage clock buffers to clock skew between the sequential circuit placement areas corresponding to each of the final-stage clock buffers. For example, clock skew between the sequential circuit placed in the sequential circuit placement area 253 to which a clock is supplied from the final-stage clock buffer 249 and the sequential circuit placed in the sequential circuit placement area 254 to which a clock is supplied from the final-stage clock buffer 250 equals to a difference in the transmission delay between the path from the root clock buffer 244 to the final-stage clock buffer 249 and the path from the root clock buffer 244 to the final-stage clock buffer 250.

In this way, the sequential circuit placement area is divided by each final-stage clock buffer supplying a clock thereto, and clock skew of the all the divided areas is calculated, which composes the clock skew information. This embodiment calculates the clock skew between specific sequential circuits based on this clock skew information in the timing-driven placement process.

An example of the operation of the timing-driven placement of this invention is explained hereinafter.

Figure 7:
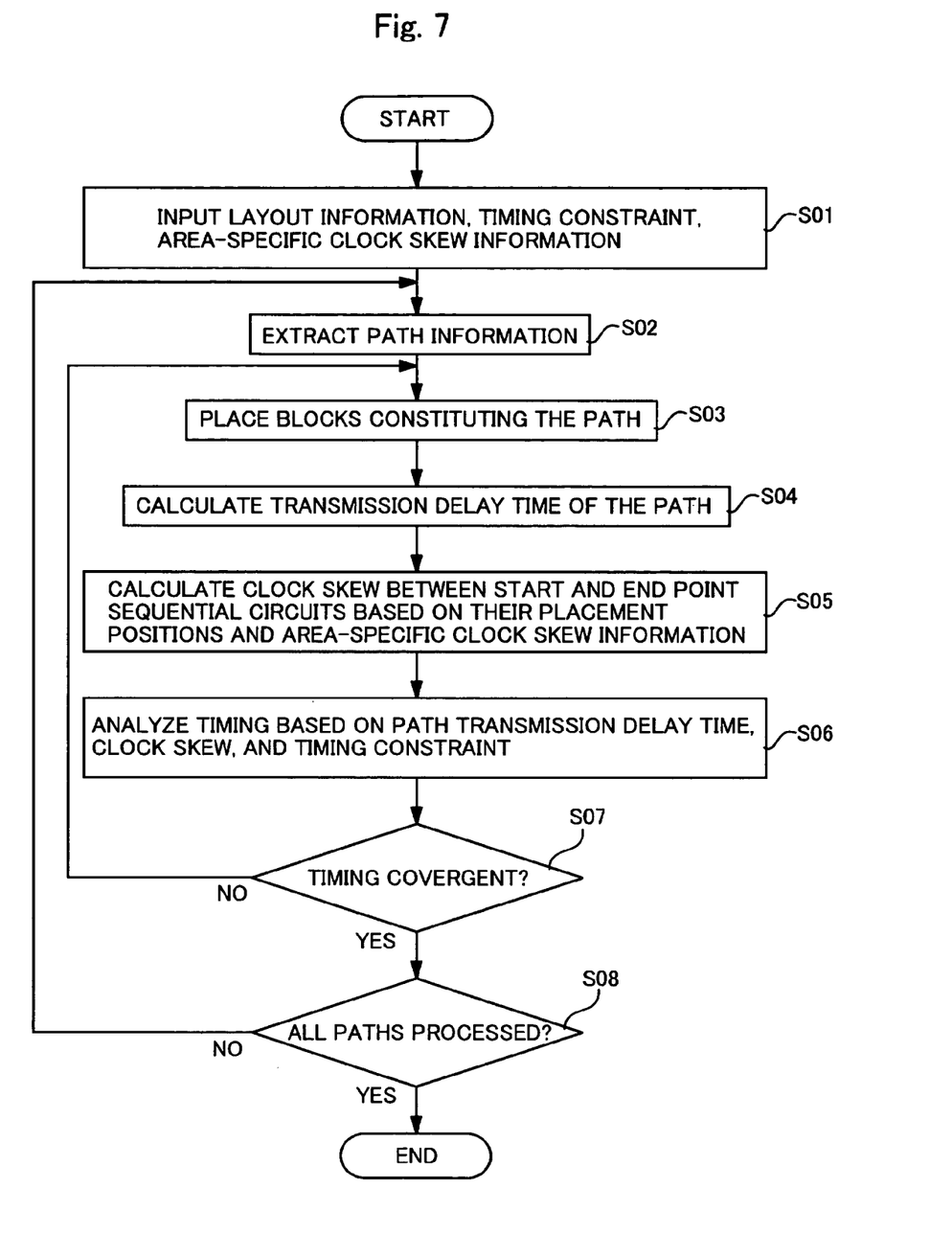
FIG. 7 is a flowchart showing an example of the operation of timing-driven placement according to the present invention.

FIG. 7 is a flowchart showing an example of the operation of the timing-driven placement process.

Initially in Step S01, the process inputs and stores layout information, timing constraints, and area-specific clock skew information.

After the input of the information, the process proceeds to Step S02, where it extracts connection information of a specific sequential circuit path to which transmission delay constraint is given based on the timing constraint information. Then, the process tentatively places all the blocks constituting the path in Step S03.

In Step S04, the process estimates line delay between blocks and gate delay in the block from the types of blocks constituting the path which are tentatively placed and distance between the blocks and calculates a transmission delay time of the entire path.

In Step 05, the process extracts the placement position of the start and end point sequential circuits at both ends of the path which are tentatively placed. Then, it calculates the clock skew between the start and end point sequential circuits based on the position of the start and end point sequential circuits on the path and the area-specific clock skew information. The start and end point sequential circuits are, for example, the sequential circuits 232 and 233 at both ends of a specific path as shown in FIG. 4. Data is transmitted between the start and end point sequential circuits.

Finally in Step 06, the process performs timing analysis based on the path transmission delay time calculated in Step S04, the clock skew between the start and endpoint sequential circuits calculated in the Step S05, and the timing constraints.

If the timing analysis result shows that the setup and hold time requirements represented by expressions (1) and (2) are not satisfied on the path, the process returns to S03 for the placement of blocks constituting the path (NO in S07). If, on the other hand, the requirements are satisfied, the process on the subject path ends (YES in S07). Then, if an unprocessed path exists, the process returns to S02 for the path information extraction (No in S08), and, if all the paths are done, the timing-driven placement process completes (YES in S08).

As descried above, it is possible in this embodiment to consider the clock skew almost the same as an actual value calculated from the preformed clock circuit in the process of determining the placement position of the blocks constituting a path between sequential circuits. Thus, if the expressions (1) and (2) are satisfied in the timing-driven placement processor, the timing analysis result based on the actual clock skew after the placement is likely to meet the setup and hold time requirements.

A second embodiment of the present invention is explained hereinafter.

In order for the path that meets the setup and hold time requirements in the placement processor to completely avoid the problem which is not given by the timing analysis based on the actual clock skew after the placement, this embodiment calculates a clock transmission delay value from the root clock buffer to all the sequential circuits both for the cases where the number of sequential circuits connected to each final-stage clock buffer is maximum and where it is minimum when forming the area-specific clock skew information. Then, it compares a difference in the clock transmission delay in each of the divided sequential circuit areas for every final-stage clock buffer, and uses the greatest difference in delay as the clock skew between the sequential circuit areas for the timing-driven placement process. Thus, this embodiment determines the clock skew between the placement areas in consideration of a delay difference depending on the number of sequential circuits placed in one sequential circuit area.

For example, FIG. 6 shows the clock circuit where each final-stage clock buffer drives up to six sequential circuits. In this clock circuit, when calculating the clock skew between the sequential circuit placement area 253 to which a clock is supplied from the final-stage clock buffer 249 and the sequential circuit placement area 254 to which a clock is supplied from the final-stage clock buffer 250, it is necessary to calculate the clock transmission delay values from the root clock buffer 244 to the sequential circuit about four cases, which are, the cases of connecting one sequential circuit, which is minimum, to the final-stage clock buffer 249 or 259, and connecting six sequential circuits, which is maximum, to the final-stage clock buffer 249 or 259.

The transmission delay on the clock path from the root clock buffer 244 through the final-stage clock buffer 249 to one sequential circuit is T1min, the transmission delay on the clock path from the root clock buffer 244 through the final-stage clock buffer 249 to six sequential circuits is T1max, the transmission delay on the clock path from the root clock buffer 244 through the final-stage clock buffer 250 to one sequential circuit is T2min, the transmission delay on the clock path from the root clock buffer 244 through the final-stage clock buffer 250 to six sequential circuits is T2max. If it is assumed that the value of T2max−T1min is greater than the value of T1max−T2min, the clock skew between the sequential circuit placement areas 253 and 254 is T2max−T1min.

In this case, the clock skew to be considered in the timing-driven placement process increases in whole due to a difference in the transmission delay from the input terminal of each final-stage clock buffer to the input terminal of the sequential circuit which varies by the number of connected sequential circuits and influence of variation in chip on the clock path from the input terminal of each final-stage clock buffer to the input terminal of the sequential circuit. However, the increased skew value compared with the first embodiment is much smaller than the skew value due to the influence of variation in chip on the whole clock circuit.

Thus, this embodiment further facilitates to satisfy the expressions (1) and (2) in all the sequential circuits within the timing-driven placement processor, compared to the case of setting all the clock skew values of the sequential circuits to be considered in the placement processor to a maximum value of the clock skew calculated from the preformed clock circuit.

It is apparent that the present invention is not limited to the above embodiment, that may be modified and changed without departing from the scope and spirit of the invention.

What is claimed is:

1. A method of designing an integrated circuit where a clock circuit having a clock supply path from a root clock buffer to a plurality of final-stage buffers is preformed, and each of the plurality of final-stage buffers supplies one or more sequential circuits placed in a respective clock supply area of the plurality of final-stage buffers with a clock, the method comprising:
   calculating a clock skew value between start and end point sequential circuits at both ends of a specific sequential circuit path based on a plurality of placement positions of the sequential circuits calculated from the preformed clock circuits and clock skew information correlating the plurality of placement positions corresponding to the plurality of sequential circuits with clock skew between placement positions arbitrarily selected from the plurality of placement positions; and
   performing placement of sequential circuits in consideration of the calculated clock skew value.

2. The method of designing an integrated circuit according to claim 1, wherein the clock skew information is correlated with the clock skew between placement positions, the clock skew being clock transmission delay difference between the final-stage buffers supplying the clock supply area including the placement positions with a clock.

3. The method of designing an integrated circuit according to claim 1, wherein clock skew between placement positions is determined in consideration of a delay difference by the number of sequential circuits placed in one sequential circuit placement area.

4. The method of designing an integrated circuit according to claim 1, further comprising:
   extracting connection information of a sequential circuit path and tentatively placing blocks constituting the path;
   calculating a transmission delay time of the whole path of the tentatively placed blocks;
   extracting placement areas of start and end point sequential circuits at both ends of the path;
   calculating a clock skew value between the start and end point sequential circuits based on clock skew information correlating placement areas of sequential circuits with clock skew between the placement areas;
   analyzing timing based on the transmission delay time, the clock skew information, and a timing constraint; and
   if the analyzed timing does not meet a predetermined requirement, performing the tentative placement of the blocks, calculation of the transmission delay time, extraction of the placement area of the start and end point sequential circuits, calculation of the clock skew value between the start and end point sequential circuits, and analysis of the timing once again without correcting the preformed clock circuit; and
   if the analyzed timing meets a predetermined requirement, performing placement of sequential circuits in consideration of the calculated clock skew.

5. The method of designing an integrated circuit according to claim 4 herein the clock skew information is correlated with the clock skew between placement areas, the clock skew being clock transmission delay difference between the final-stage buffers supplying the clock supply area including the placement area with a clock.

6. The method of designing an integrated circuit according to claim 4, wherein clock skew between placement areas is determined in consideration of a delay difference by the number of sequential circuits placed in one sequential circuit placement area.

7. A design system of an integrated circuit where a clock circuit having a clock supply path from a root clock buffer to a plurality of final-stage buffers is preformed, and each of the plurality of final-stage buffers supplies one or more sequential circuits placed in a respective clock supply area of the plurality of final-stage buffers with a clock, the system comprising:
   a storage unit storing a plurality of placement positions of the sequential circuits calculated from the preformed clock circuits and clock skew information correlating the plurality of placement positions corresponding to the plurality of sequential circuits with clock skew between placement positions arbitrarily selected from the plurality of placement positions; and a placement processing unit calculating a clock skew value between start and end point sequential circuits at both ends of a specific sequential circuit path and performing placement of sequential circuits in consideration of the calculated clock skew value.

8. The design system of an integrated circuit according to claim 7 wherein the clock skew information is correlated with the clock skew between placement positions, the clock skew being clock transmission delay difference between the final-stage buffers supplying the clock supply area including the placement positions with a clock.

9. The design system of an integrated circuit according to claim 7 wherein clock skew between placement positions is determined in consideration of a delay difference by the number of sequential circuits placed in one sequential circuit placement area.

* * * * *